(12) United States Patent
Takagi

(10) Patent No.: US 9,300,890 B2
(45) Date of Patent: Mar. 29, 2016

(54) IMAGING AND RANGING DEVICES AND APPARATUS HAVING FIRST AND SECOND IMAGING AREAS WITH DISCRETE PIXEL ARRANGEMENTS

(71) Applicant: CANON KABUSHIKI KAISHA, Tokyo (JP)

(72) Inventor: Akinari Takagi, Yokosuka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 199 days.

(21) Appl. No.: 14/016,905

(22) Filed: Sep. 3, 2013

(65) Prior Publication Data
US 2014/0071320 A1    Mar. 13, 2014

(30) Foreign Application Priority Data
Sep. 12, 2012  (JP) .................................. 2012-200414

(51) Int. Cl.
| H04N 5/369 | (2011.01) |
| H04N 5/335 | (2011.01) |
| H04N 5/232 | (2006.01) |
| H04N 9/04 | (2006.01) |
| H04N 5/222 | (2006.01) |

(52) U.S. Cl.
CPC ......... *H04N 5/3696* (2013.01); *H04N 5/23212* (2013.01); *H04N 5/335* (2013.01); *H04N 9/045* (2013.01); *H04N 5/2226* (2013.01)

(58) Field of Classification Search
None
See application file for complete search history.

(56) References Cited

U.S. PATENT DOCUMENTS

| 8,514,309 B2 | 8/2013 | Kato et al. |
| 8,525,282 B2 | 9/2013 | Numata et al. |
| 2011/0249161 A1 | 10/2011 | Takagi |
| 2012/0293706 A1* | 11/2012 | Usui .............................. 348/345 |
| 2013/0277541 A1 | 10/2013 | Ikemoto et al. |

FOREIGN PATENT DOCUMENTS

| JP | 2007155929 A * | 6/2007 |
| JP | 4797606 B2 | 10/2011 |

\* cited by examiner

*Primary Examiner* — Justin P Misleh
(74) *Attorney, Agent, or Firm* — Fitzpatrick, Cella, Harper & Scinto

(57) ABSTRACT

An imaging device includes a first imaging area having a plurality of first pixels and a plurality of second pixels arranged therein and a second imaging area having a plurality of first pixels and a plurality of third pixels arranged therein. Each of the first pixels, each of the second pixels and each of the third pixels receive a light flux from first, second and third pupil areas, respectively, of the exit pupil of an optical system and operate for photoelectric conversion. The second and third pupil areas are decentered to opposite directions to each other relative to the center of gravity of the exit pupil. The first and second imaging areas are displaced to opposite directions as corresponding to the decentered directions of the second and third pupil areas relative to a position on the imaging device where the optical axis of the optical system passes.

14 Claims, 7 Drawing Sheets

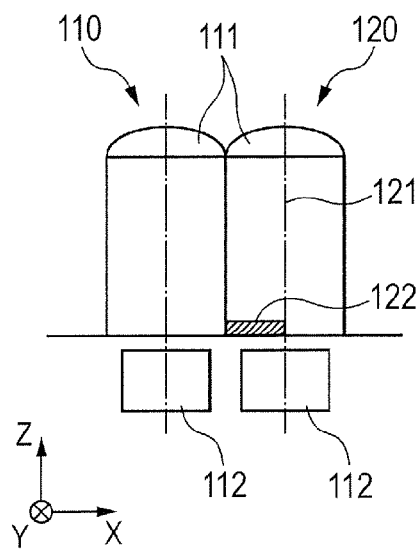
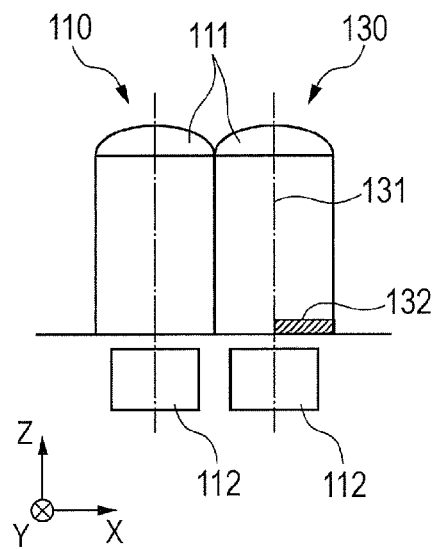
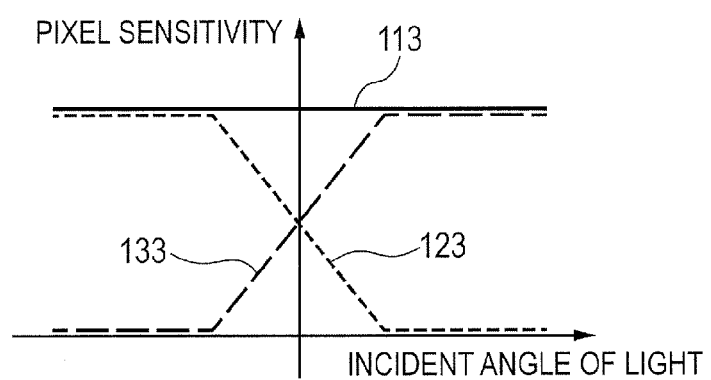
FIG. 3

IMAGING AND RANGING DEVICES AND APPARATUS HAVING FIRST AND SECOND IMAGING AREAS WITH DISCRETE PIXEL ARRANGEMENTS

BACKGROUND OF THE INVENTION

1. Field of the Invention

The present invention relates to a solid-state imaging device. More particularly, the present invention relates to an imaging apparatus to be used for a digital still camera, a digital video camera or the like.

2. Description of the Related Art

A solid-state imaging device formed by arranging ranging pixels having a ranging function as part or all of the pixels of the imaging device so as to detect the state of focus adjustment by way of a phase difference detection type process has been proposed (see Japanese Patent No. 4,797,606). A ranging pixel has a microlens and a light shielding plate arranged at a position that is optically conjugated with the exit pupil of the camera lens by way of the microlens. With this arrangement, a light flux that passes through a partial area on the pupil of the camera lens is guided to a photoelectric conversion section. Additionally, ranging pixels are provided to receive light fluxes in areas that are decentered in opposite directions relative to each other from the center of the pupil of the camera lens, which serves as reference position. Then, a plurality of optical images (to be referred to as ranging images hereinafter) generated by the light fluxes that pass through different pupil areas can be acquired by means of the signals obtained by the ranging pixels. Thus, the distance to an object can be measured by computing the quantity of defocus by means of triangulation using 3D images on the basis of the quantities of displacement of the acquired ranging images. With such a proposed device, the distance to the object is measured unlike conventional contrast detection type devices and hence the lens of the camera including such a device does not need to be moved for focusing. In other words, high speed and high accuracy ranging operations can be realized with such a device.

However, a device as described above is accompanied by a problem that the image quality of the obtained ranging images is poor to consequently degrade the ranging accuracy depending on the shooting conditions of the camera including such a device. Generally, the exit pupil of a camera lens changes its position according to its conditions in terms of zooming and focusing. Therefore, when the light shielding plate of a ranging pixel gets out of the conjugate relationship with the exit pupil, the quantity of decentering of the pupil area through which the light flux to be received by the ranging pixel passes varies as a function of the position of the ranging pixel in the imaging device. As the quantity of decentering increases, a ranging image is formed only by a light flux that passes through a peripheral section in the pupil of the camera lens. Generally, since light fluxes that pass through peripheral sections in the pupil of a camera lens are accompanied by large aberrations if compared with light fluxes that pass through center sections of the pupil, the ranging images formed by the former light fluxes are apt to represent a duller image contrast due to the aberrations. Using poor quality ranging images entails large reading errors in the quantities of image displacements to by turn reduce the ranging accuracy.

SUMMARY OF THE INVENTION

In view of and to solve the above-identified problem, the present invention provides an imaging device for receiving a light flux from an exit pupil of an optical system, comprising: a first imaging area having a plurality of first pixels and a plurality of second pixels arranged therein; and a second imaging area having a plurality of first pixels and a plurality of third pixels arranged therein, each of the first pixels being configured so as to receive a light flux from a first pupil area of the exit pupil of the optical system and operate for photoelectric conversion, each of the second pixels being configured so as to receive a light flux from a second pupil area of the exit pupil of the optical system and operate for photoelectric conversion, the second pupil area including a part of the first pupil area and being decentered relative to a center of gravity of the exit pupil to a first direction, and each of the third pixels being configured so as to receive a light flux from a third pupil area of the exit pupil of the optical system and operate for photoelectric conversion, the third pupil area including a part of the first pupil area and being decentered relative to the center of gravity of the exit pupil to a second direction opposite to the first direction, the first imaging area being displaced to a direction corresponding to one of the first and second directions relative to a position on the imaging device where an optical axis of the optical system passes, the second imaging area being displaced to a direction corresponding to the other of the first and second directions relative to the position on the imaging device where the optical axis of the optical system passes.

High quality ranging images can be acquired and ranging operations can be conducted highly accurately by using an imaging device according to the present invention for a ranging device, an imaging apparatus or the like.

Further features of the present invention will become apparent from the following description of exemplary embodiments with reference to the attached drawings.

BRIEF DESCRIPTION OF THE DRAWINGS

FIGS. 2A and 2B are schematic cross-sectional views of principal parts of pixels.

FIG. 3 is a schematic illustration of the pixel characteristics of different pixels.

DESCRIPTION OF THE EMBODIMENTS

An imaging device according to the present invention includes at least first through third pixels and includes a first imaging area where a plurality of first pixels and a plurality of second pixels are arranged and a second imaging area where a plurality of first pixels and a plurality of third pixels are arranged. The first imaging area is disposed at a position displaced to one of the opposite sides on the imaging device that correspond to the first and second directions from the center, which is defined as the position of the imaging device where the optical axis of the optical system passes and the second imaging area is disposed at a position displaced to the other one of the opposite sides. As a ranging device is provided with such an imaging device, distance information on an object can be acquired by using the output signal of the first pixels, the output signal of the second pixels and the output signal of the third pixels or by using the output signal of the first pixels, the output signal of the fourth pixels, which will be described hereinafter, and the output signal of the fifth pixels, which will also be described hereinafter. Then, ranging operations can be conducted highly accurately. When an imaging apparatus such as a digital camera is provided with such a ranging device, high quality images of objects can be obtained by means of the imaging apparatus. With a ranging method to be used with such a ranging device, the output signal of a plurality of pixels and a signal obtained by subtracting the output signal of the pixels that require attention from the output signal obtained from the first pixels arranged near the pixels requiring attention are employed to acquire ranging image signals. A ranging operation can be conducted highly accurately by means of ranging computations using high quality ranging images.

Now, a ranging device and an imaging apparatus that include an imaging device according to the present invention will be described blow by referring to the accompanying drawings that illustrate embodiment of the invention. Throughout the drawings, devices and components thereof that are functionally the same and identical are denoted by the same reference numbers and will not be described repeatedly.

First Embodiment

Figure 1A:
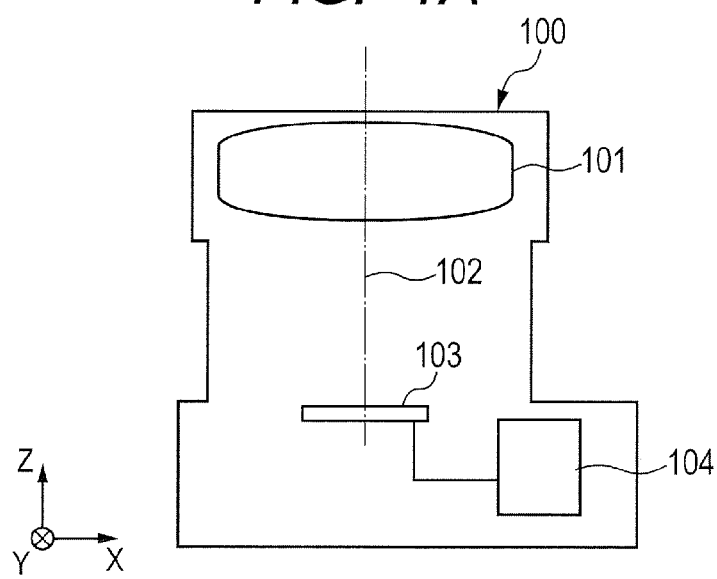
FIGS. 1A and 1B are a schematic illustration of an imaging apparatus including an imaging device and a schematic illustration of a pixel arrangement at and near the center of the imaging device.
Figure 1B:
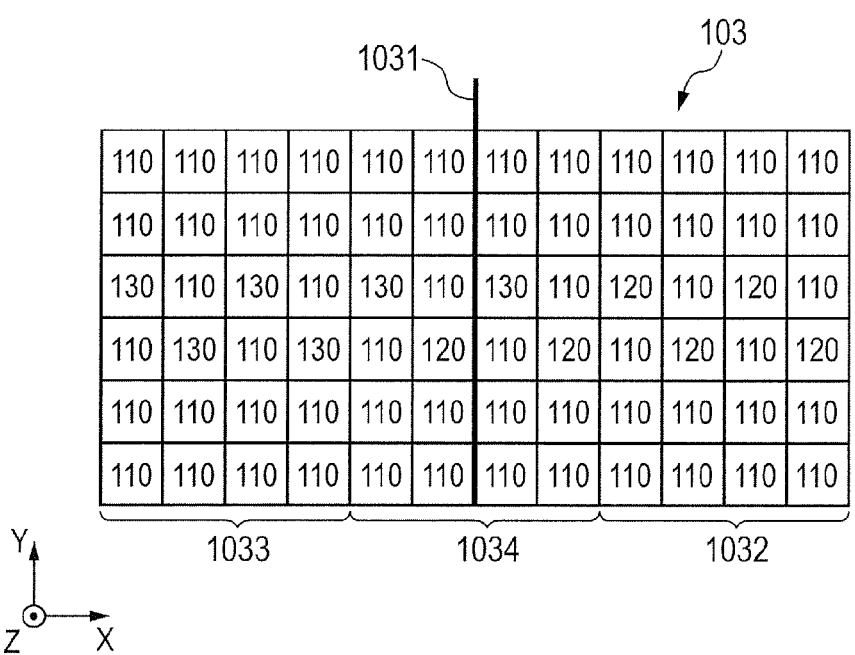

FIGS. 1A and 1B schematically illustrate an exemplar configuration of a digital camera 100 including a ranging device, which includes an imaging device according to the present invention. Referring to FIG. 1A, the digital camera 100 includes an imaging lens 101 that is an optical system for forming an image of an object, an imaging device 103 appropriately positioned relative to the imaging lens 101 and a ranging computing section 104 to which signals are input from the imaging device 103. The imaging device 103 is arranged on the optical axis 102 of the imaging lens 101 and the imaging lens 101 forms an image of an object on the imaging device 103.

FIG. 1B is a schematic illustration of the pixel arrangement at and near the center of the imaging device 103 (in an area at and near the position where the optical axis 102 passes). Pixels 110 are the first pixels, each of which receives a light flux coming from the first pupil area of the exit pupil of the imaging lens 101 and operates for photoelectric conversion. The first pupil area is an area that includes the geometric center or the center of gravity of the exit pupil. Pixels 120 are the second pixels, each of which receives a light flux coming from the second pupil area, which is a part of or includes the first pupil area, and operates for photoelectric conversion. The second pupil area is an area that is decentered from the geometric center of the exit pupil in the first direction (−X direction). The geometric center of the exit pupil can be defined in this embodiment because the exit pupil is assumed to have a rotationally symmetric shape around the optical axis 102, such as a circular shape or a square shape. However, if the exit pupil have a shape that is not rotationally symmetric, the center of the exit pupil cannot be defined and hence the second pupil area needs to be expressed as being decentered in the first direction (−X direction) from the center of gravity of the exit pupil (which is also the geometric center of the exit pupil when the exit pupil has a rotationally symmetric shape). Pixels 130 are the third pixels, each of which receives a light flux coming from the third pupil area, which is a part of or includes the first pupil area, and operates for photoelectric conversion. The third pupil area is an area that is decentered from the geometric center of the exit pupil in the second direction (+X direction) that is a direction substantially opposite to the second pupil area. The state of being decentered of the third pupil area is similar to that of being decentered of the second pupil area.

Area 1032 (the first imaging area) is an area where a plurality of pixels 110 and a plurality of pixels 120 are arranged. Area 1033 (the second imaging area) is an area where a plurality of pixels 110 and a plurality of pixels 130 are arranged. The area 1032 and the area 1033 are arranged at the opposite sides of boundary line 1031, which boundary line 1031 is a line segment that passes through the geometric center of the imaging device 103 and runs perpendicularly relative to the directions on the imaging device that correspond to the first and second directions so as to be interposed between the area 1032 and the area 1033. In a more general expression, the area 1032 is displaced to and arranged at one side and the area 1033 is displaced to and arranged at the opposite side the first imaging area being disposed at a position displaced to one of the opposite sides relative to the directions on the imaging device 103 that correspond to the first and second directions from the center that is defined as the position in the imaging device 103 where the optical axis 102 of the optical system passes. In this embodiment, the third imaging area 1034 where a plurality of pixels 110, 120 and 130 are arranged is disposed between the area 1032 and the area 1033 (and hence the third imaging area 1034 is a center area that includes the position on the imaging device where the optical axis of the optical system passes). Note that, while each of the areas is formed by 4 rows of pixels in FIG. 1B for the purpose of simplicity, each of the areas may be formed by much more rows of pixels, for example several tens of rows.

The ranging computing section 104 determines the distance to an object on the basis of the positional displacements of the images (raging images) formed by the light fluxes that pass through different pupil areas by means of a known technique. With regard to the third imaging area 1034, the output signal from the plurality of pixels 120 and the output signal from the plurality of pixels 130 are employed as ranging image signals. With regard to the area 1032, the output signal from the plurality of pixels 120 and the signal obtained by subtracting the output signal of the pixels 120 from the output signal of the pixels 110 that are arranged adjacent to the pixels 120, which require attention, are employed as ranging image signals. With regard to the area 1033, the output signal from the plurality of pixels 130 and the signal obtained by subtracting the output signal of the pixels 130 from the output signal of the pixels 110 that are arranged adjacent to the pixels 130, which require attention, are employed as ranging image signals.

FIGS. 2A and 2B are schematic cross-sectional views of principal parts of the pixels 110, 120 and 130. Each of the pixels includes wiring and a color filter, which are not-illustrated. As illustrated in FIG. 2A, pixel 110 includes a microlens 111 and a photoelectric conversion section 112. Pixel 120 includes a microlens 111, a light shielding section 122 arranged at a position decentered from the pixel central axis 121 in the −X direction and a photoelectric conversion section 112. In this embodiment, the optical axis of the microlens 111 is made to agree with the pixel central axis 121 and the end facet of the light shielding section 122 at the pixel center side is made to agree with the pixel central axis 121. Additionally as illustrated in FIG. 2B, pixel 130 includes a microlens 111, a light shielding section 132 arranged at a position decentered from the pixel central axis 131 in the +X direction and a photoelectric conversion section 112. Like the pixel 120, the optical axis of the microlens 111 is made to agree with the pixel central axis 131 and the end facet of the light shielding section 132 at the pixel center side is made to agree with the pixel central axis 131. With the above-described arrangement, the pixel sensitivity of each pixel can be made to represent incident angle dependence.

FIG. 3 schematically illustrates the incident angle dependence of the pixel sensitivities of pixels. In FIG. 3, the horizontal axis represents the incident angle of light relative to each pixel in a XZ cross section and the vertical axis represents the pixel sensitivity of each pixel. The pixel 110 represents a flat sensitivity characteristic 113 (solid line). The sensitivity characteristics 123 (dotted line) of the pixel 120 is such that the pixel 120 is highly sensitive to incident light coming from a negative direction (−X direction) and lowly sensitive to incident light coming from a positive direction (+X direction). The sensitivity characteristic 133 (broken line) of the pixel 130 is such that the pixel 130 is lowly sensitive to incident light coming from a negative direction (−X direction) and highly sensitive to incident light coming from a positive direction (+X direction). When the distance between the exit pupil of the imaging lens 101 and the imaging device 103 is infinitely large, the sensitivity characteristic 123 and the sensitivity characteristic 133 are made to represent profiles that are symmetric to each other relative to the incident angle of 0° so that the second pupil area and the third pupil area may be arranged axially symmetrically relative to the central axis on the exit pupil.

Now, the reason why high quality ranging images can be obtained and highly accurate ranging operations can be realized according to the present invention including this embodiment will be described below. If the distance between the exit pupil of the imaging lens 101 and the imaging device 103 is held to be constantly infinitely large, the second pupil area and the third pupil area are arranged centrally symmetrically on the exit pupil when the pixels represent the pixel characteristics as illustrated in FIG. 3. Therefore, the two ranging images of the two areas are formed by light fluxes found at and near the geometric center (center of gravity) of the exit pupil and hence sharp contrast images can be obtained. However, due to the demand for downsizing, actual imaging lenses are so designed that the position of the exit pupil is shifted according to the zooming condition of the lens. In general, the position of the exit pupil is located remote from the imaging device at the telephoto side of the zoom lens, whereas the position of the exit pupil is located close to the imaging device at the wide angle side of the zoom lens. Additionally, when the imaging lens is of the inner focus type or of the rear focus type, the position of the exit pupil varies as a function of the state of focus.

Figure 4A:
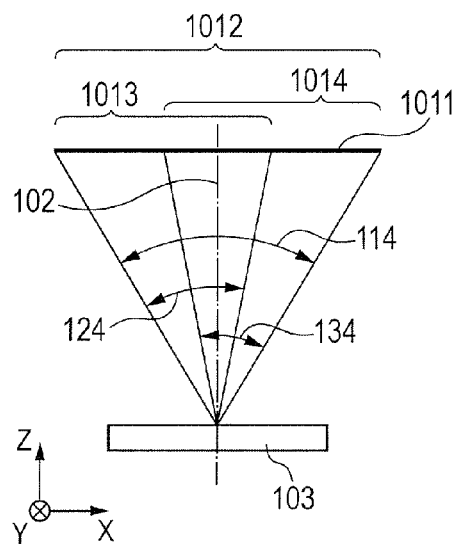
FIGS. 4A, 4B and 4C are a schematic illustration of the states of light fluxes in different areas of an imaging device.
Figure 4B:
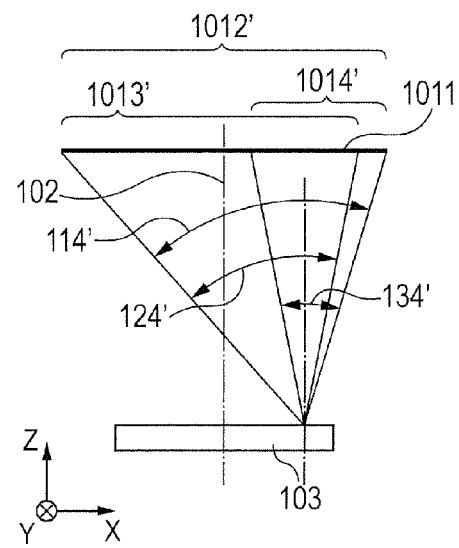
Figure 4C:
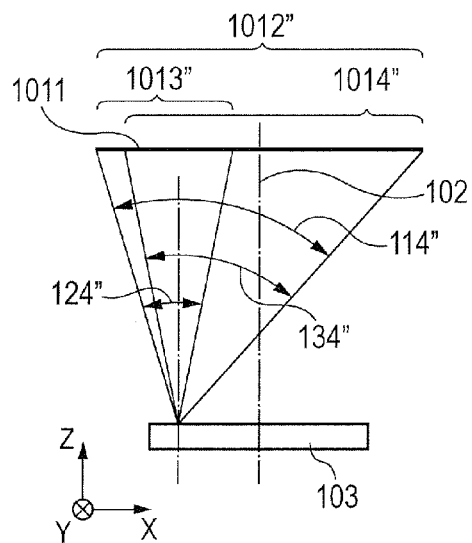

FIGS. 4A through 4C schematically illustrate instances where the exit pupil 1011 of the imaging lens 101 is at a finite distance position from the imaging device 103 (which correspond to, for example, shooting operations using the wide angle side of the zoom lens). FIG. 4A illustrates the light fluxes in the third imaging area 1034, which is located at and near the center of the imaging device 103. The pixels 110 receive light fluxes 114 from the first pupil area 1012 of the exit pupil 1011 and operate for photoelectric conversion. The pixels 120 receive light fluxes 124 from the second pupil area 1013 of the exit pupil 1011 and operate for photoelectric conversion. The pixels 130 receive light fluxes 134 from the third pupil area 1014 of the exit pupil 1011 and operate for photoelectric conversion. As described above, the ranging computing section 104 determines the distance to an object on the basis of the positional displacements of the raging images formed by the light fluxes that pass through the different pupil areas by means of a known technique. The ranging computing section 104 employs the output signal from the plurality of pixels 120 and the output signal from the plurality of pixels 130 as ranging image signals.

FIG. 4B illustrates how light fluxes appear in the area 1032 of the imaging device 103. The pixels 110 receive light fluxes 114' from the first pupil area 1012' of the exit pupil 1011 and operate for photoelectric conversion. The pixels 120 receive light fluxes 124' from the second pupil area 1013' of the exit pupil 1011 and operate for photoelectric conversion. The ranging computing section 104 determines the distance to the object by means of a known technique as described above, employing the output signal from the plurality of pixels 120 and the signal obtained by subtracting the output signal of the pixels 120 from the output signal of the plurality of pixels 110 that are arranged adjacent to the pixels 120, which require attention, as ranging image signals. Conventionally, pixels 130 are also arranged in the area that corresponds to the area 1032 illustrated in FIG. 4B. When pixels 120 or pixels 130 are arranged across the entire surface of an imaging device, the contrast of the ranging image formed by an output signal from the pixels in any of the peripheral sections of the imaging device is dull and the ranging accuracy is degraded. When pixels 120 and pixels 130 are arranged across the entire surface of an imaging device, the contrast of the ranging image formed by the output signal of either the pixels 120 or the pixels 130 is dull and the ranging accuracy is degraded in the circumferential sections of the imaging device.

The reason for this problem will be described below. The light fluxes 134' from the third pupil area 1014' of the exit pupil 1011 are those that pass only peripheral sections of the exit pupil 1011 and represent large ray aberrations including comas. Therefore, the contrast of the ranging image formed by light fluxes 134' and output from the pixels 130 is dull and the quality of the ranging image is poor. Large errors can be produced when the positional displacements are computationally determined by using signals of poor quality ranging images. For this reason, ranging computations are conducted for the present invention including this embodiment without employing signals of ranging images formed by light fluxes that pass only peripheral sections of pixels. In other words, according to the present invention, a ranging image signal that is formed by light fluxes 134' coming from the third pupil area 1014' of the exit pupil 1011 is actually obtained by determining the ranging image signal by subtracting the output signal of the pixels 120 from the output signal of the pixels 110.

FIG. 4C illustrates light fluxes appearing in the area 1033 of the imaging device 103. The pixels 110 receive light fluxes 114' from the first pupil area 1012' of the exit pupil 1011 and operate for photoelectric conversion. The pixels 130 receive light fluxes 134" from the second pupil area 1014" of the exit pupil 1011 and operate for photoelectric conversion. The ranging computing section 104 determines the distance to the object by means of a known technique as described above, employing the output signal from the plurality of pixels 130 and the signal obtained by subtracting the output signal of the pixels 130 from the output signal of the plurality of pixels 110 that are arranged adjacent to the pixels 130, which require attention, as ranging image signals. As in the case of the area 1032 illustrated in FIG. 4B, a high quality ranging image can be obtained from the area 1033 so that ranging operations can be executed highly accurately.

As illustrated in FIG. 4B, the second pupil area 1013' is larger than the third pupil area 1014' and hence receives a greater quantity of light than the third pupil area 1014'. Similarly, as illustrated in FIG. 4C, the third pupil area 1014" is larger than the second pupil area 1013" and hence receives a greater quantity of light than the second pupil area 1013". Therefore, either area provides a large image signal output and hence can reduce any signal degradation due to noises at the time of photoelectric conversion and signal transfer. Thus, high quality ranging images (high quality ranging signals) can be obtained from either area so that ranging operations can be executed highly accurately.

As described above, the configuration of this embodiment allows the entire surface of the imaging device to realize highly accurate ranging operations regardless of the zooming condition and the focusing condition of the imaging lens.

While the output signal from the plurality of pixels 120 and the signal obtained by subtracting the output signal of the pixels 120 from the output signal of the pixels 110 that are arranged adjacent to the pixels 120, which require attention, are employed as ranging image signals of the area 1032, the present invention is by no means limited thereto. Alternatively, the signal obtained by subtracting the output signal of the pixels 120 from the output signal average value of the plurality of pixels 110 that are arranged adjacent to the pixels 120, which require attention, may be employed. The influence of noises and so on can be reduced so that ranging operations can be executed highly accurately by using the average value of the output signals from a plurality of pixels. This description equally applies to the ranging image signals obtained from the area 1033.

Figure 5:
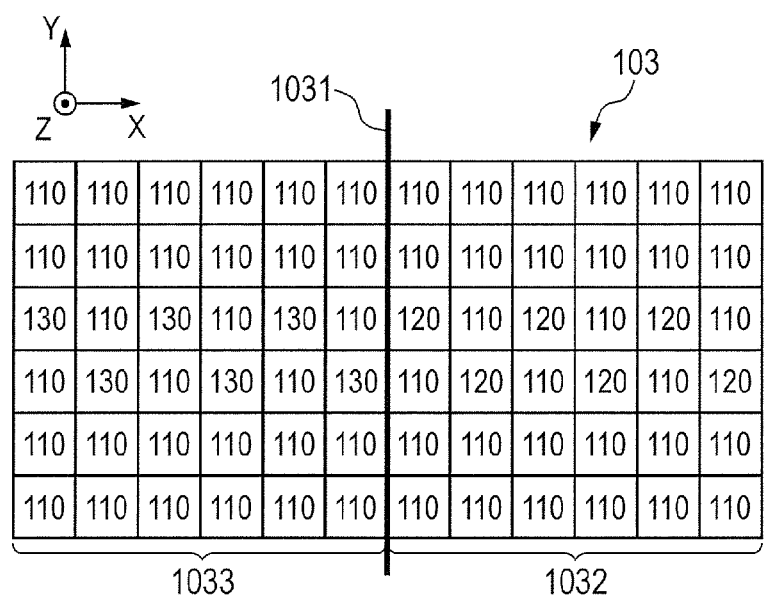
FIG. 5 is a schematic illustration of a pixel arrangement at and near the center of an imaging device that is different from FIG. 1B.

While the third imaging area 1034 that includes pixels 120 and pixels 130 is provided in this embodiment, the center area 1034 may not necessarily be provided as illustrated in FIG. 5. Note, however, that as a result of arranging the area 1034, two ranging images can be directly obtained from the area 1034 so that consequently the load of computing operations can be reduced to raise the computing speed and reduce the power consumption. Additionally, the error rate of each of the areas can be reduced by using a plurality of signal processing techniques at and near the boundaries of the areas. While pixels 120 and pixels 130 are arranged in a zigzag manner in this embodiment, a pixel 120 and a pixel 130 may alternatively be arranged at every third or every fourth pixel depending on the required ranging accuracy.

The following arrangement is desirable in view of the fact that the position of the exit pupil of an imaging lens is generally located at the +Z side relative to the corresponding imaging device. Namely, the decentered direction of the second pupil area 1013 (−X direction, which is the first direction) and the decentered direction of the first imaging area 1032 relative to the center of the imaging device (+X direction, which is the direction on the imaging device that corresponds to the first direction) are desirably opposite to each other. However, when the position of the exit pupil of an imaging lens is located at the −Z side relative to the corresponding imaging device, the decentered direction of the second pupil area 1013 is desirably the same as the decentered direction of the first imaging area 1032 relative to the center of the imaging device. The above description also applies to the decentered direction of the third pupil area 1014 and the decentered direction of the second imaging area 1033 relative to the center of the imaging device.

Second Embodiment

Now, a second embodiment will be described as an instance having an optimized configuration when the position of the exit pupil of an imaging lens is located close to an imaging device. This embodiment differs from the first embodiment in that the pixels 110 of the first embodiment are replaced by pixels 160 illustrated in FIG. 6A and the pixels 120 of the first embodiment are replaced by pixels 170 illustrated in FIG. 6A, while the pixels 130 of the first embodiment are replaced by pixels 180 illustrated in FIG. 6B.

Figure 6A:
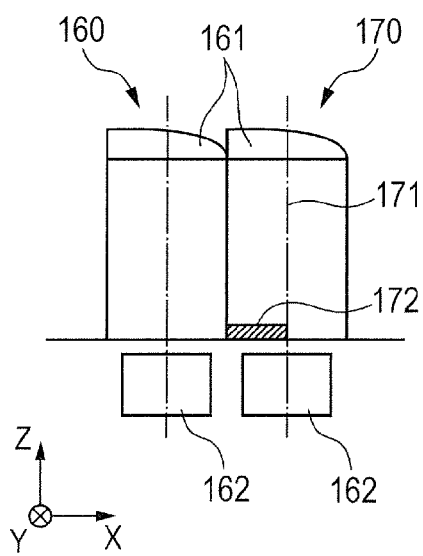
FIGS. 6A and 6B are schematic cross-sectional views of principal parts of pixels that are different from those of FIGS. 2A and 2B.
Figure 6B:
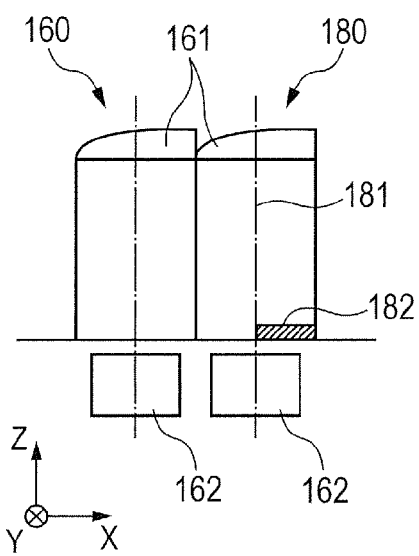

FIGS. 6A and 6B are schematic cross-sectional views of principal parts of the pixels. Each of the pixels 110 includes wiring and a color filter, which are not-illustrated. As illustrated in FIG. 6A, pixel 160 includes a microlens 161 and a photoelectric conversion section 162. The microlens 161 is arranged at a decentered position such that the principal ray of light that passes through the geometric center (center of gravity) of the exit pupil 1011 of the imaging lens 101 strikes the center of the photoelectric conversion section 162. Pixel 170 includes a microlens 161, a light shielding section 172 arranged at a position decentered from the pixel central axis 171 in the −X direction and a photoelectric section 162. Additionally as illustrated in FIG. 6B, pixel 180 includes a microlens 161, a light shielding section 182 arranged at a position decentered from the pixel central axis 181 in the +X direction and a photoelectric conversion section 162. With the above-described arrangement, the pixel sensitivity of each pixel can be made to represent incident angle dependence.

Figure 7A:
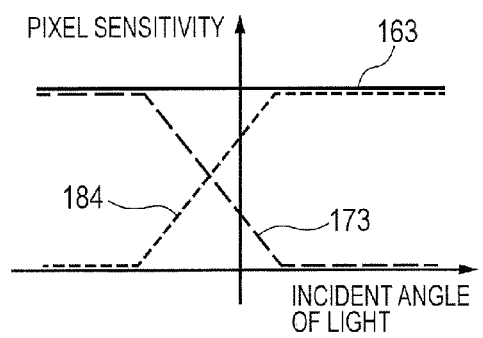
FIGS. 7A and 7B are a schematic illustration of the pixel characteristics of different pixels that are different from those of FIG. 3.
Figure 7B:
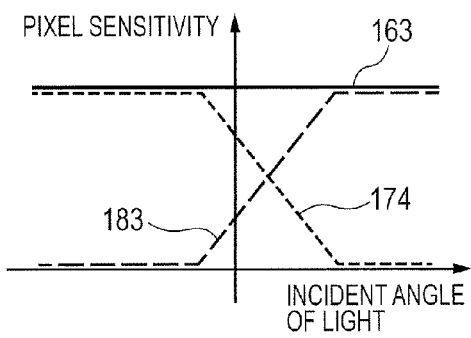

FIGS. 7A and 7B schematically illustrate the incident angle dependence of the pixel sensitivity of each pixel. In each of FIGS. 7A and 7B, the horizontal axis represents the incident angle of light relative to each pixel in a XZ cross section and the vertical axis represents the pixel sensitivity of each pixel. The pixel 160 represents a flat sensitivity characteristic 163 (solid line). As illustrated in FIG. 7A, the sensitivity characteristics 173 (broken line) of the pixel 170 is such that the pixel 170 is highly sensitive to incident light coming from a negative direction (−X direction) and lowly sensitive to incident light coming from a positive direction (+X direction). Note that the sensitivity characteristic 173 is shifted to the negative side if compared with the sensitivity characteristic (123 in FIG. 3) of the pixel 120. As illustrated in FIG. 7B, the sensitivity characteristic 183 (broken line) of the pixel 180 is such that the pixel 180 is lowly sensitive to incident light coming from a negative direction (−X direction) and highly sensitive to incident light coming from a positive direction (+X direction). Note that the sensitivity characteristic 183 is shifted to the positive side if compared with the sensitivity characteristic (133 in FIG. 3) of the pixel 130. The sensitivity characteristic 184 (dotted line) in FIG. 7A is the one that is obtained when the pixel 180 is made to include a microlens 161 as illustrated in FIG. 6A. The sensitivity characteristic 184 is represented for reference. The sensitivity characteristic 174 (dotted line) in FIG. 7B is the one that is obtained when the pixel 170 is made to include a microlens 161 as illustrated in FIG. 6B. The sensitivity characteristic 174 is represented for reference.

Figure 8A:
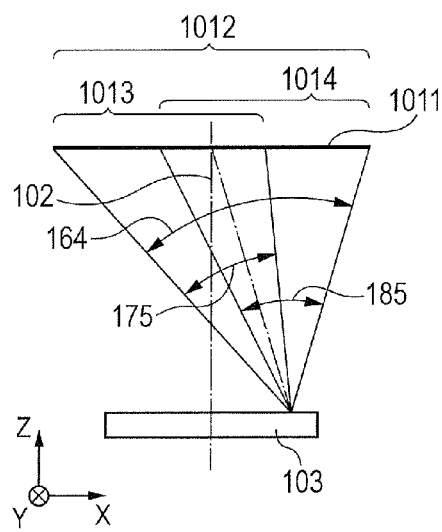
FIGS. 8A and 8B are a schematic illustration of the states of light fluxes in different areas of an imaging device that are different from those of FIGS. 4A through 4C.
Figure 8B:
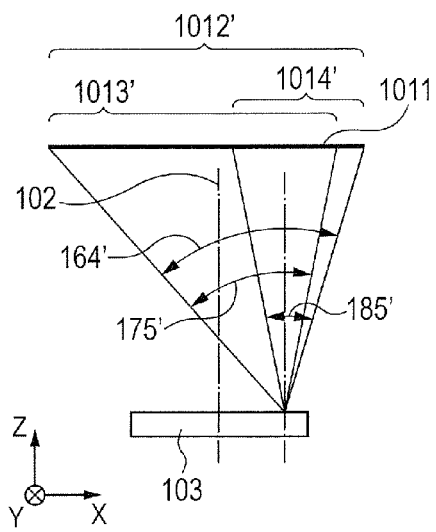

FIGS. 8A and 8B illustrate the light fluxes in the area 1032 of the imaging device 103. FIG. 8A schematically illustrates an instance where the exit pupil 1011 of the imaging lens 101 is at a finite distance position from the imaging device 103. In such an instance, the pixels 160 receive light fluxes 164 from the first pupil area 1012 of the exit pupil 1011 and operate for photoelectric conversion. The pixels 170 receive light fluxes 175 from the first pupil area 1013 of the exit pupil 1011 and operate for photoelectric conversion. The ranging computing section 104 determines the distance to the object by means of a known technique as described above, employing the output signal from the plurality of pixels 170 and the signal obtained by subtracting the output signal of the pixels 170 from the output signal of the plurality of pixels 160 that are arranged adjacent to the pixels 170, which require attention, as ranging image signals.

FIG. 8B schematically illustrates an instance where the exit pupil 1011 of the imaging lens 101 is located at a position remote from the imaging device 103 (which corresponds, for example, to an instance where the telephoto side of the zoom lens is employed for shooting). In such an instance, the pixels 160 receive light fluxes 164' from the first pupil area 1012' of the exit pupil 1011 and operate for photoelectric conversion. The pixels 170 receive light fluxes 175' from the second pupil area 1013' of the exit pupil 1011 and operate for photoelectric conversion. The ranging computing section 104 determines the distance to the object by means of a known technique as described above, employing the output signal from the plurality of pixels 170 and the signal obtained by subtracting the output signal of the pixels 170 from the output signal of the plurality of pixels 160 that are arranged adjacent to the pixels 170, which requires attention, as ranging image signals.

Similarly, with regard to the area 1033 of the imaging device 103, the output signal from the plurality of pixels 180 and the signal obtained by subtracting the output signal of the pixels 180 from the output signal of the plurality of pixels 160 that are arranged adjacent to the pixels 180, which require attention, are employed as ranging image signals.

As illustrated in FIG. 8B, when the shooting conditions differ from those that are found when the sensitivity characteristics of the pixels are determined, conventional arrangements cannot provide accurate ranging operations for the reason described above for the first embodiment. Namely, the ranging images that are obtained by arranging pixels that receive light fluxes 185 and operate for photoelectric conversion are images formed only by light fluxes passing through peripheral sections of the exit pupil and hence represents a dull contrast and hence the ranging accuracy is degraded. This embodiment generates ranging image signals that are formed by light fluxes 185' from the third pupil area 1014' of the exit pupil 1011 by computations. Therefore, the quantity of any image displacement can be detected highly accurately to allow ranging operations to be executed highly accurately.

As described above, the configuration of this embodiment allows the entire surface of the imaging device to realize highly accurate ranging operations regardless of the zooming condition and the focusing condition of the imaging lens as in the instance of the first embodiment.

Third Embodiment

Figure 9A:
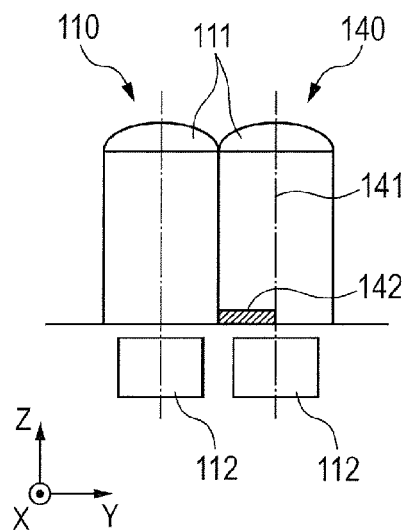
FIGS. 9A and 9B are schematic cross-sectional views of principal parts of pixels that are different from those of FIGS. 2A, 2B, 6A and 6B.
Figure 9B:
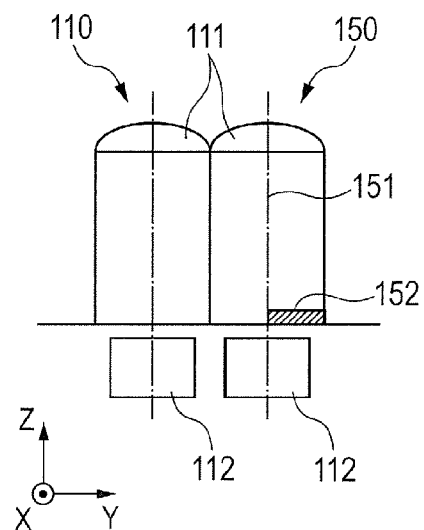

Now, an instance where the present invention is applied to a ranging device in which the pupil is divided also in the Y-direction for ranging operations will be described below. FIGS. 9A and 9B are schematic cross-sectional views of principal parts of pixels arranged to divide pupil in Y-direction. Wiring and a color filter which are contained in each pixel are not shown in these drawings. As illustrated in FIG. 9A, each fourth pixel 140 includes a microlens 111, a light shielding section 142 arranged at a position decentered from the pixel central axis 141 in the −Y direction (third direction) and a photoelectric conversion section 112. In this embodiment, the optical axis of the microlens 111 is made to agree with the pixel central axis 141 and the end facet of the light shielding section 142 at the pixel center side is made to agree with the pixel central axis 141. Additionally as illustrated in FIG. 9B, fifth pixel 150 includes a microlens 111, a light shielding section 152 arranged at a position decentered from the pixel central axis 151 in the +Y direction (fourth direction) and a photoelectric conversion section 112. Like the pixel 140, the optical axis of the microlens 111 is made to agree with the pixel central axis 151 and the end facet of the light shielding section 152 at the pixel center side is made to agree with the pixel central axis 151. With the above-described arrangement, the pixel sensitivity of each pixel can be made to represent incident angle dependence in YZ cross section.

Figure 10:
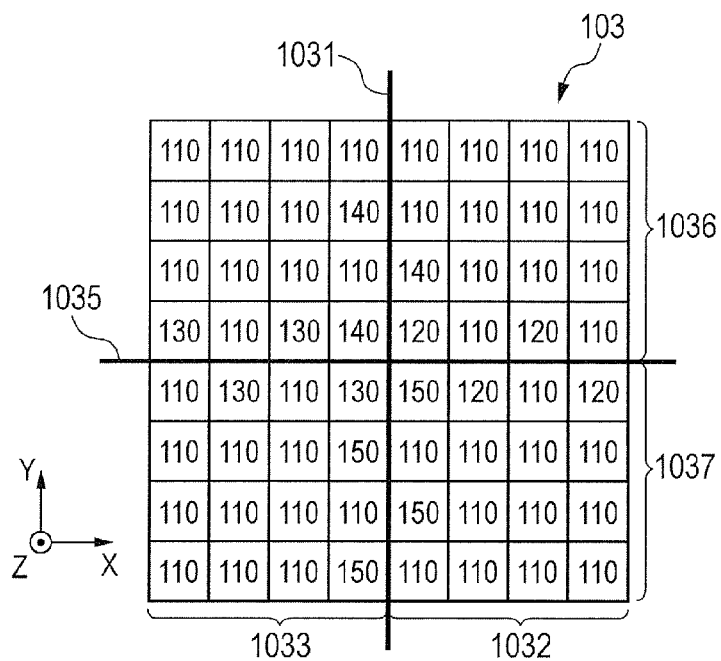
FIG. 10 is a schematic illustration a pixel arrangement at and near the center of an imaging device that is different from those of FIGS. 1B and 5.

FIG. 10 is a schematic illustration of the pixel arrangement at and near the center of the imaging device 103. Pixels 140 are the fourth pixels, each of which receives a light flux coming from the fourth pupil area, which is a part of or includes the first pupil area and decentered from the geometric center (center of gravity) of the exit pupil in the third direction (−Y direction), and operates for photoelectric conversion. Pixels 150 are the fifth pixels, each of which receives a light flux coming from the fifth pupil area, which is a part of or includes the first pupil area and decentered from the geometric center (center of gravity) of the exit pupil in the fourth direction (+Y direction) that is a direction substantially opposite to the fourth pupil area and operates for photoelectric conversion. Area 1036 (the fourth imaging area) is an area where a plurality of pixels 110 and a plurality of pixels 140 are arranged. Area 1037 (the fifth imaging area) is an area where a plurality of pixels 110 and a plurality of pixels 150 are arranged. The area 1036 and the area 1037 are arranged at the opposite sides of boundary line 1035, which is a line segment that passes through the geometric center of the imaging device 103 and runs perpendicularly relative to the second direction so as to be interposed between the area 1036 and the area 1037. Note that, while each of the areas is formed by 4 rows of pixels in FIG. 10 for the purpose of simplicity, each of the areas may be formed by much more rows of pixels, for example several tens of rows.

In this embodiment again, the ranging computing section 104 determines the distance to an object on the basis of the positional displacements of the images (raging distance images) formed by the light fluxes that pass through different pupil areas by means of a known technique. With regard to the area 1036, the output signal from the plurality of pixels 140 and the signal obtained by subtracting the output signal of the pixels 140 from the output signal of the plurality of pixels 110 that are arranged adjacent to the pixels 140, which require attention, are employed as ranging image signal. With regard to the area 1037, the output signal from the plurality of pixels 150 and the signal obtained by subtracting the output signal of the pixels 150 from the output signal of the plurality of pixels 110 that are arranged adjacent to the pixels 150, which require attention, are employed as ranging image signal. With the above-described arrangement, an accurate ranging operation can be conducted for an object formed by arranging line segments extending in the X-direction and high quality ranging images can be acquired regardless of the shooting conditions for the reason same as the one described above for the first embodiment.

Figure 11A:
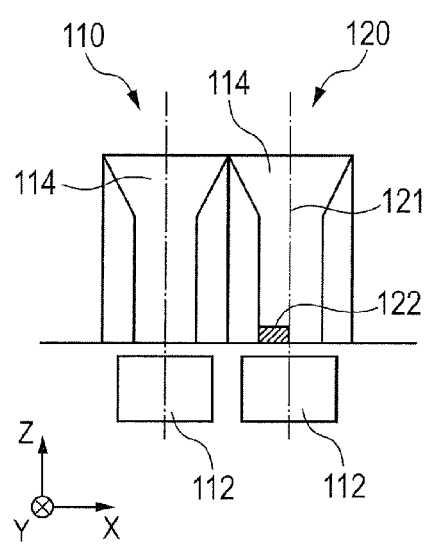
FIGS. 11A and 11B are schematic cross-sectional views of principal parts of pixels that are different from those of FIGS. 2A, 2B, 6A, 6B, 9A and 9B.
Figure 11B:
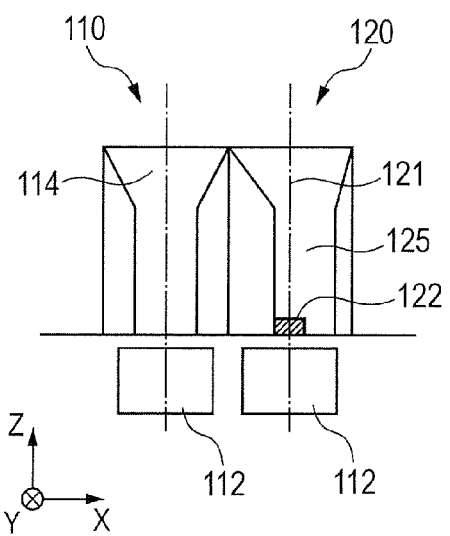

Pixels including a microlens and a light shielding member arranged at a decentered position relative to the pixel central axis are employed in the above-described embodiments. However, the present invention is by no means limited thereto. To provide the pixel sensitivity of a pixel with incident angle dependence, an alternative arrangement as illustrated in FIG. 11A may be employed. In this arrangement, a waveguide 114 that guides a light flux to the photoelectric conversion section and a light shielding section 122 having an asymmetric profile and arranged at a decentered position relative to the pixel central axis 121 are employed as illustrated in FIG. 11A. Still alternatively, an arrangement of employing a waveguide 125 having an asymmetric profile and arranged at a decentered position relative to the pixel central axis 121 and a light shielding section 122 arranged on the pixel central axis 121 may be employed as illustrated in FIG. 11B. In other words, the second pixels etc. may be made to include a waveguide that guides the light flux it receives to the photoelectric conversion section and a light shielding member arranged in the waveguide disposed in front of the photoelectric conversion section relative to the direction of light flux propagation. In any of these instances, the waveguide and/or the light shielding member represent an asymmetric profile relative to the pixel central axis. With an arrangement of using a waveguide (particularly having a core section that is inversely tapered toward the light receiving side as illustrated in FIGS. 11A and 11B), light that enters the pixel can efficiently be guided to the photoelectric conversion section to obtain a higher quality ranging image and conduct a more accurate ranging operation.

An imaging device according to the present invention as described above can find applications in the field of ranging devices and imaging apparatus that requires the use of a ranging device such as digital cameras. Note, however, that the imaging device needs to be appropriately positioned relative to the optical system for forming an image of an object according to the configuration of the imaging device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-200414, filed Sep. 12, 2012 which is hereby incorporated by reference herein in its entirety.

What is claimed is:

1. An imaging device for receiving a light flux from an exit pupil of an optical system, comprising:
a first imaging area having a plurality of first pixels and a plurality of second pixels arranged therein; and
a second imaging area having a plurality of first pixels and a plurality of third pixels arranged therein, wherein
each of the first pixels being configured so as to receive a light flux from a first pupil area of the exit pupil and operate for photoelectric conversion,
each of the second pixels being configured so as to receive a light flux from a second pupil area of the exit pupil and operate for photoelectric conversion, the second pupil area including a part of the first pupil area and being decentered relative to a center of gravity of the exit pupil to a first direction,
each of the third pixels being configured so as to receive a light flux from a third pupil area of the exit pupil and operate for photoelectric conversion, the third pupil area including a part of the first pupil area and being decentered relative to the center of gravity to a second direction opposite to the first direction,
the first imaging area being displaced to a direction corresponding to one of the first and second directions relative to a position on the imaging device where an optical axis of the optical system passes,
the second imaging area being displaced to a direction corresponding to the other of the first and second directions relative to the position,
the first imaging area only having the first and second pixels from among the first, second and third pixels arranged therein, or having the first, second and third pixels with the number of the second pixels being not less than five times the number of the third pixels arranged therein,
the second imaging area only having the first and third pixels from among the first, second and third pixels arranged therein, or having the first, second and third pixels with the number of the third pixels being not less than five times the number of the second pixels arranged therein, and
the first imaging area and the second imaging area being arranged at opposite sides of a first boundary line which passes through a geometric center of the imaging device and runs on the imaging device perpendicularly relative to the first and second directions so as to be interposed between the first and second imaging areas.

2. The imaging device according to claim 1, wherein the first direction and the direction to which the first imaging area is displaced relative to the second image area are opposite relative to each other.

3. The imaging device according to claim 1, wherein a third imaging area having a plurality of second pixels and a plurality of third pixels is arranged in a center area including the position.

4. The imaging device according to claim 1, wherein each of the second pixels has a microlens and a light shielding member arranged as decentered relative to a pixel central axis and each of the third pixels has a microlens and a light shielding member arranged as decentered oppositely to the light shielding member of the second pixel.

5. The imaging device according to claim 1, wherein each of the second and third pixels has a waveguide disposed in front of a photoelectric conversion section relative to the direction of light flux propagation, for guiding a light flux it receives to the photoelectric conversion section, and a light shielding member arranged in the waveguide and the waveguide and/or the light shielding member has an asymmetric shape relative to a pixel central axis.

6. A ranging device comprising:
the imaging device according to claim 1; and
a ranging computing section configured to acquire distance information on an object, using an output signal of the first pixels, an output signal of the second pixels and an output signal of the third pixels.

7. The ranging device according to claim 6, wherein the ranging computing section uses the output signal of the second pixels and the signal computationally determined by using the output signal of the first pixels and the output signal of the second pixels with regard to the first imaging area while it uses the output signal of the third pixels and the signal computationally determined by using the output signal of the first pixels and the output signal of the third pixels with regard to the second imaging area.

8. An imaging apparatus comprising the ranging device according to claim 6 and an optical system for forming an image of an object.

9. An imaging device for receiving a light flux from an exit pupil of an optical system, comprising:
a first imaging area having a plurality of first pixels and a plurality of second pixels arranged therein;
a second imaging area having a plurality of first pixels and a plurality of third pixels arranged therein;
a fourth imaging area having a plurality of first pixels and a plurality of fourth pixels arranged therein; and
a fifth imaging area having a plurality of first pixels and a plurality of fifth pixels arranged therein, wherein
each of the first pixels being configured so as to receive a light flux from a first pupil area of the exit pupil and operate for photoelectric conversion,
each of the second pixels being configured so as to receive a light flux from a second pupil area of the exit pupil and operate for photoelectric conversion, the second pupil area including a part of the first pupil area and being decentered relative to a center of gravity of the exit pupil to a first direction,
each of the third pixels being configured so as to receive a light flux from a third pupil area of the exit pupil and operate for photoelectric conversion, the third pupil area including a part of the first pupil area and being decentered relative to the center of gravity to a second direction opposite to the first direction,
each of the fourth pixels being configured so as to receive a light flux from a fourth pupil area of the exit pupil and operate for photoelectric conversion, the fourth pupil area including a part of the first pupil area and being decentered relative to the center of gravity to a third direction different from the first direction and the second direction,
each of the fifth pixels being configured so as to receive a light flux from a fifth pupil area of the exit pupil and operate for photoelectric conversion, the fifth pupil area including a part of the first pupil area and being decentered relative to the center of gravity to a fourth direction opposite to the third direction,
the first imaging area being displaced to a direction corresponding to one of the first and second directions relative to a position on the imaging device where an optical axis of the optical system passes,
the second imaging area being displaced to a direction corresponding to the other of the first and second directions relative to the position,
the first imaging area only having the first and second pixels and at least one of the fourth and fifth pixels arranged therein,
the second imaging area only having the first and third pixels and at least one of the fourth and fifth pixels arranged therein,
the first imaging area and the second imaging area being arranged at opposite sides of a first boundary line which passes through a geometric center of the imaging device and runs on the imaging device perpendicularly relative to the first and second directions so as to be interposed between the first and second imaging areas,
the fourth imaging area being displaced to a direction corresponding to one of the third and fourth directions relative to the position,
the fifth imaging area being displaced to a direction corresponding to the other of the third and fourth directions relative to the position, wherein
the fourth imaging area having at least the first and fourth pixels arranged therein, and
the fifth imaging area having at least the first and fifth pixels arranged therein.

10. The imaging device according to claim 9, wherein the fourth imaging area and the fifth imaging area being arranged at opposite sides of a second boundary line which passes through a geometric center of the imaging device and runs on the imaging device perpendicularly relative to the first and second directions so as to be interposed between the fourth and fifth imaging areas.

11. The imaging device according to claim 7, wherein the third direction and the direction to which the fourth imaging area is displaced relative to the fifth image area are opposite relative to each other.

12. A ranging device comprising:
the imaging device according to claim 7, and
a ranging computing section configured to acquire distance information on an object, using an output signal of the first pixels, an output signal of the fourth pixels and an output signal of the fifth pixels.

13. The ranging device according to claim 12, wherein the ranging computing section uses the output signal of the fourth pixels and the signal computationally determined by using the output signal of the first pixels and the output signal of the fourth pixels with regard to the fourth imaging area while it uses the output signal of the fifth pixels and the signal computationally determined by using the output signal of the first pixels and the output signal of the fifth pixels with regard to the fifth imaging area.

14. An imaging apparatus comprising the ranging device according to claim 12 and an optical system for forming an image of an object.

* * * * *